(12) United States Patent
Huang

(10) Patent No.: US 10,058,773 B2
(45) Date of Patent: Aug. 28, 2018

(54) MAN-MACHINE INTERACTION CONTROLLING METHOD AND APPLICATIONS THEREOF

(71) Applicant: Defeng Huang, Zhangzhou (CN)

(72) Inventor: Defeng Huang, Zhangzhou (CN)

(*) Notice: Subject to any disclaimer, the term of this patent is extended or adjusted under 35 U.S.C. 154(b) by 1077 days.

(21) Appl. No.: 13/963,666

(22) Filed: Aug. 9, 2013

(65) Prior Publication Data
US 2013/0331964 A1    Dec. 12, 2013

Related U.S. Application Data

(63) Continuation of application No. PCT/CN2012/000108, filed on Jan. 20, 2012.

(30) Foreign Application Priority Data

Feb. 11, 2011 (CN) .......................... 2011 1 0036356
Dec. 30, 2011 (CN) .......................... 2011 1 0458168

(51) Int. Cl.
*G06F 17/50* (2006.01)
*A63F 13/20* (2014.01)
(Continued)

(52) U.S. Cl.
CPC .............. *A63F 13/20* (2014.09); *A63F 13/23* (2014.09); *A63F 13/422* (2014.09); *A63F 13/428* (2014.09); *G06F 3/011* (2013.01); *G06F 3/04815* (2013.01); *A63F 13/21* (2014.09); *A63F 2300/1087* (2013.01);
(Continued)

(58) Field of Classification Search
USPC ........................................................ 703/2, 6
See application file for complete search history.

(56) References Cited

U.S. PATENT DOCUMENTS 5,577,981 A    11/1996    Jarvik
5,913,727 A    6/1999    Ahdoot
(Continued)

FOREIGN PATENT DOCUMENTS

CN    1231753    10/1999
CN    101890237    11/2010

*Primary Examiner* — Thai Phan
(74) *Attorney, Agent, or Firm* — Rabin & Berdo, P.C.

(57) ABSTRACT

A man-machine interaction controlling method and applications thereof are provided. A user performs user permitted micro-actions to control a self-role in a virtual environment to perform a virtual permission action plan on an operation position. The method includes steps of: 1) creating the self-role in the virtual environment; 2) performing micro-actions without leaving the position where the user stays; 3) tracing and recognizing the micro-action permitted by the user to enable the user need not leave away the position where the user stays when performing any micro-actions; 4) enabling the self-role to enlarge the micro-action of the user. Further an action enlarging system enables the user to control the self role in the virtual environment to do any actions while the user need not leave away from the control platform, further enables the user in the same operation platform during the operation process and easy to achieve that the kinetic parts of the user keep identical with the virtual action parts of the virtual role in the virtual environment, thereby the user is easy to operate.

16 Claims, 14 Drawing Sheets

(51) Int. Cl.

| | | |
|---|---|---|
| *A63F 13/428* | (2014.01) | |
| *A63F 13/422* | (2014.01) | |
| *G06F 3/01* | (2006.01) | |
| *G06F 3/0481* | (2013.01) | |
| *A63F 13/23* | (2014.01) | |
| *A63F 13/21* | (2014.01) | |

(52) U.S. Cl.
CPC ......... *A63F 2300/5553* (2013.01); *A63F 2300/6045* (2013.01); *A63F 2300/6054* (2013.01); *A63F 2300/6607* (2013.01); *G06F 17/5009* (2013.01)

(56) References Cited

U.S. PATENT DOCUMENTS

| | | | |
|---|---|---|---|
| 7,205,979 B2 | 4/2007 | Zimmerman et al. | |
| 8,793,498 B2 * | 7/2014 | Sun .................... | H04N 1/32144 |
| | | | 382/232 |
| 9,143,392 B2 * | 9/2015 | Duchesneau ......... | G06F 9/5072 |
| 2008/0016580 A1 * | 1/2008 | Dixit .................... | G06F 21/604 |
| | | | 726/27 |
| 2009/0216910 A1 * | 8/2009 | Duchesneau ......... | G06F 9/5072 |
| | | | 709/250 |
| 2013/0306276 A1 * | 11/2013 | Duchesneau ......... | G06F 9/5072 |
| | | | 165/104.21 |

* cited by examiner

MAN-MACHINE INTERACTION CONTROLLING METHOD AND APPLICATIONS THEREOF

TECHNICAL FIELD

The present invention relates to a method for controlling a bionic virtual environment that can enable a man-machine interaction and applications thereof.

BACKGROUND

Known technologies give multi-types methods and devices for controlling a bionic virtual environment which can enable a man-machine interaction, but they all have defects: needing big size motion space of user and the motions are limited (only limited number of actions of the self-role are permitted). For instance when the user moves to a wall, but the next action of the game avatar requires the user moves backward to the wall. In order to avoid thus situation, some technologies minifies the motion space of the avatar (it will be noted that avatar is not the user) to make the user need not move or reduce movement during the controlling process, but thus reduces the game playability and limits the application value of the game. Some known technologies using treadmills to make the user move in the same place, but thus technologies also have defects: requiring big energy expenditure of the user and thereby the user can not do the man-machine interaction for a long time and it is difficult to make the user to move freely. The known technology for minifying the motion space of the avatar further includes operating moving tools, such as a chariot. The self-role in a virtual environment operates all the process and can only perform the actions for operating the chariot or other similar type of motor device, and can not leave away from the chariot to perform the actions without the limitation of action morphology or action range. However, besides the above described defect, the traditional way further includes defects of too many controlling elements, high cost, and inconveniently carrying.

In addition, various reasons of the known technology results in limited numbers of action of the self-role are permitted, and the action range is unadjustable or the adjustable action range is fixed, that is to say, in any action, a distance between any two parts of the virtual role is unadjustable at the defined process point, or can be adjust to another or some other fixed value, such as let the virtual role perform a simple step action. If performing the time for completing a complete step action is taken as a period, when performing the particular ratio progress (e.g. 1/5 period), the number of the adjustable values of the distance between the two soles of the self-role just is two (e.g. walking status value, running status value).

SUMMARY

The object of the present invention is for providing a method and device to enable the user to enter into the virtual environment as if the user is personally on a scene of the virtual environment. The self-role can perform any action that the user want to perform, and the system need not limit the action gesture and action morphology of the actions permitted by the self-role. Simultaneously, the other problems referred in the background are also overcome.

In order to understand the present invention more easily, the term referred in the present invention are explained below.

Self-role: refers virtual roles, controlled by the user and taken as the user in the virtual environment, is person or any object capable moving.

User permitted micro-action plan: can give a command to a computer when the user performs one or a set of satisfied micro-actions. The micro-action refers the action with small range, such as the moving displacement of any kinetic parts less than 20 mm within 1 second, for example micro movement of the arm, micro bend of the foot. The above condition especially includes the kinetic parts of the user do not control or do not completely control the associated virtual action parts of the self-role.

Virtual permission action plan: the virtual environment defines the actions or action plan for the self-role or the prop in the virtual environment, the action plan includes the continuous action combination, the action strength, the action speed, and so on.

Kinetic parts: not all the kinetic parts of the user can be used to control the virtual action parts of the self-role, especially if the self-role is nonhuman, they do not have some kinetic parts of the user, so the kinetic parts in the present invention refers some parts on the user's body corresponding to the virtual action parts of self-role, which defined by the virtual environment. In another aspect, when the number of the virtual action parts of the self-role is larger than the kinetic parts of the user, other method described in the present invention can be used. Further, the kinetic parts in the present disclosure are not limited to the junction between the two adjacent bones, any parts, such as any point on the upper arm, that can be moved can be taken as the kinetic parts, such as all the upper arm or any point of the upper arm.

Reverse actions: the virtual environment where the self-role is in performs vector actions which have same vector value and reverse direction with the command given by the user, the vector action especially refers to the displacement change and volume change in any time point of the present invention. As shown in FIG. 1, if the user intend to step or run 5 meters toward southeast direction from time t1 to time t2, the self-role can be controlled to forward 5 meters toward northwest direction during the period t1 to t2. For another example, if the user intends his/her body to be enlarged 2 times proportionally, the scene where the self-role is in is reduced 2 times. Especially, it should be first determine whether the eyes or a distance between the eyes are includes in the form or shape change command, if the eyes and the distance between the eyes are not changed, the volume of the scene is also not changed, namely, the volume vector action of the scene and the volume vector action of the eyes and the distance between the eyes have the same vector value and reverse direction. The user's command is preferably associating the movement vector and vision vector of the head of the self-role, wherein, the movement vector can be speed and displacement, the vision vector can be the volume change of the self-role.

Palm: as shown in FIG. 2, the palm 1 includes the wrist 11 and all the joints of the palm 1, such as fingers 12.

Sole: as shown in FIG. 2, the sole 2 includes the ankle 11 and all the joints of the sole 2, such as toes 22.

The action range evaluating indicator: this is for evaluating a movement indicator of the traced parts at a certain time point, or a total movement indicator until the certain time point. So the indicator can be the speed of the traced part at the certain time point, and also can be the indicator of the change of the relative position of the traced parts and the other parts at the certain time point, and also can be the total indicator of the change of the relative position of the traced parts and the other parts until the certain time point, such as the changed speed of the angle between the traced part and the adjacent part of the traced part at the certain time point or the angle difference value between the angle between the traced part and the adjacent part of the traced part at the certain time point and a default angle, and further can be the displacement and direction of the tracing part, the angle between the tracing parts in two different time points. The action range evaluating indicators are not limited the above described examples.

Action enlargement: in order to simulate the real feeling of the user and the synchronization requirement during the interaction process, the following two rules are set (the following two rules are not the necessary rules to achieve the objet of the present invention):

1. within the sensing ability range of the body of the user, the action enlargement is preferred to enlarge the action range and strength, the action range evaluating indicator can be the tension range of the muscular of the user.

2. beyond the sensing ability range of the body of the user, the action enlargement can enlarge the speed of the action of the user.

In order to achieve the above objects, the technology schemes are disclosed below.

1. The self-role can perform any actions which the user requires and the system need not limit the gesture and type of the action permitted by the self-role.

The technology scheme of the present invention includes the following steps of:

1) creating the self-role in the virtual environment to make the self-role have more than one virtual action part;

2) associating kinetic parts of the user with the virtual action parts of the self-role, determining enlarging times of an action range of different virtual action parts relative to action range of the kinetic parts of the user, permitting gestures of the two adjacent kinetic parts of the user are different from gestures of the associating virtual actions parts of the self-role, further permitting movement morphology of the user and the self-role is different and not similar, further satisfying the self-role is not lying or siting in a movement process while the user is lying or siting on the operation position and need not leave away from the operation position;

3) performing the micro-actions by user siting or lying on an operating position;

4) Enabling the Self-Role to Enlarging the Micro-Action of the User.

Particularly, the enlarging times that the micro-action of the different parts of the user is enlarged can be different, especially to the two different parts whose enlarging time is not 1, the enlarging times of them can be different, for example, the enlarging times of the fingers is 3 at a certain time, but the enlarging times of the upper arm is 20 at the same time. The enlarging times of the same kinetic parts at different times can also be different.

Preferable Scheme 1:

A maximum range value M is set for each of the user permitted micro-actions which are performed by of the user or a prop, a maximum range value N is set for the virtual permission actions which are performed by the self-role, the N is less than a movement limit of the corresponding kinetic part of the user, supposing the action range of the micro-action permitted by the user in time t is Mt, the action range of the virtual permission action performed by the self-role is Nt, then if Mt≥M, Nt=N; if Mt<M, N>Nt>Mt. For example, if user's arm is lift 5 degrees, the self-role lift the arm completely, if user's arm is lift beyond 5 degrees, the self-role also lift the arm completely, so the 5 degree is taken as the maximum range value to lift the arm, obviously, the user's arm can lift more than 5 degrees.

Particularly, when user performs one permitted action, the actual movement limitation is larger than the maximum range of the permitted action. In order to achieve the technology effect more effectively, when the virtue environment uses the action enlarging system, it is better to limit the limbs of the user perform micro actions.

The user permitted micro action plan satisfies: when the user finishes one micro-action with the maximum range M, the angle change of any two adjacent parts of user's body, excepting palm and sole, is less than 30°. For example, one permitted micro action plan relates to the angle of the upper arm and the lower arm, the angle before performing the action is 120°, and the angle after performing the action is 140°, then the angle change of the upper arm and the lower arm is +20°. Obviously, the action morphology (or gesture) of the user and the self-role is not required to be the same or similar (the same gesture refers the self-role and the user have same gestures at a certain time; the similar gesture: the self-role and the user have different gestures at a certain time, the gestures include at least sitting or stand, the action morphology refers to moving while lying, moving while siting, moving while walking; the moving morphology of the user and the self-role are not similar refers that the user is moving while lying but the self-role is moving while walking).

Additionally, the present invention provides continuous action commands, when the user acts to an elastic device continuously, the user can keep the actions such as turning around. Therefore, the user can control the self-role to do any action under any gesture. The maximum action range M of the present invention is preferably within negative and positive 5°.

Particularly, the enlarging times that the micro-action of the different parts of the user is enlarged can be different, especially to the two different parts whose enlarging time is not 1, the enlarging times of them can be different, the enlarging times of the same kinetic parts at different times can also be different.

Preferable Scheme 2:

Limiting the movement range of user's limbs and enabling the limited parts can perform the micro-action completely while the body of the user does not leave away from the operation position, the limited scheme also can be optimized by one or more optimization schemes:

1) the user's parts is acted according to the action characters of the object when any object in the virtual environment acts to certain or some parts of self-role;

2) determining the reaction parts and effect acted to the self-role to make the corresponding acted parts of the user is proportional to the determined reaction effect according to the action characters and the instantaneous state of the self-role when the self-role acts to any object in the virtual environment;

3) making the corresponding parts of the user to be acted with a certain proportion load that the user is able to receive according to the physical fatigue degree or the biggest motion ability of the self-role.

2. The method for the virtual environment to receive the commands of the user:

The method determines the actions of the user by a micro action recognizing system, and determines the command content given by the user by associated actions, thereby controls the action of the virtual action parts of the self-role.

The micro action recognizing system sets one or more than one position sensing element on the user's body or props, and determines the gesture or action change of the user in any time according to the change of the position of the position sensing element with the time change.

A "method for determining position change of the position sensing element", a "method for controlling a self-role to act by position change of position sensing elements", and a "method for corresponding position sensing elements or the change thereof with the virtual action parts of the self-role" related to the present invention are described below in turn.

The method for determining position change of the position sensing element includes the steps of:

1) establishing a virtual three-dimensional coordinates, and determines the coordinates of the three or more than three distance measurement points which are not on the same straight line in a coordinate system;

2) measuring the distance between the a) measuring the distances between the position sensing elements and each of the distance measurement points, and then computing the three-dimensional coordinates of each of the position sensing elements at any time.

The method for controlling a self-role to act by position change of position sensing elements is provided for the N virtual action parts of the self-role, such as A1, A2, . . . An, which are defined by the virtual environment, the method controls the self-role in the following situation.

1) if each of the N kinetic parts can correspond to one kinetic parts on the user's body, setting N position sensing elements, such as N1, N2 . . . Nn on corresponding kinetic parts of the user, tracing the 3D position change of each of the position sensing elements at any time, controlling the virtual action parts of the self-role to perform actions.

2) if not all the N kinetic parts can find the corresponding kinetic parts on the user's body, supposing there are several virtual action parts Mx which can not correspond to the kinetic parts of the user, enabling the kinetic parts Nx of the user to control S virtual action parts of the self-role, such as Mx1, Mx2, . . . Mxn, and using one or all of the selecting method and the combination method to select the controlled virtual action parts Mx. The selecting method refers to after the kinetic parts determines the corresponding virtual action parts, the kinetic parts can control the virtual action parts separately. The combination method refers when the virtual action parts is required to replace, using one command or other kinetic parts Z together to correspond the different virtual action part Mx again, for example, the arms of the user can select the arms and wings of the self-role to control, if the kinetic part is the joint of toe, when the toe is curled, the wing is controlled, the one command refers to when the users gives a command satisfy the requirement, the system will pops up a selecting window and user can displace or determine the corresponding virtual action parts.

3. The invention further includes one or more of a olfactory system, a tactile system, a physical fatigue random obstacle system.

When the system recognize that the self-role is more tired, the load that the obstacle mechanism act to the corresponding parts is more larger, and the user performs the action more difficulty, and the play is more realistic.

4. The present invention further provides a wearable controlling device fit for the virtual environment.

The wearable controlling device includes palm sets, arm sets, head sets, sole sets, leg sets, buttock sets, and waist set. Each of the above sets one or more than one sensing positioning points.

The wearable controlling device further needs to satisfy the following requirements: setting one or more than one sensing positioning points on the three joints of each fingers, the joints of wrists, the joints of elbows, the joints of shoulders, any three points on the head which are not on one straight line, one joint of each toe, joints of ankles, and center of calf, thigh, and a spine.

The device aims at determining the position and gesture of the user at any time point according to the position of the sensing position points setting on the user's body.

5. The invention provides a method for the user to see his/her body entering a virtual environment.

A positioning system, a panoramic system, and a scene moving system are used together to achieve the method.

1. The scene moving system uses the reversible actions of the scene where the self-role of the virtual environment is stayed to make the user has an illusion that his/her body is moving or changing (enlarging/reducing the body or varying shape of body). The method for determining the scene wherein the self-role is in includes:

1) directly fixing positioning element, which can be moved simultaneously with a head, on the head of the user, the positioning element defines three position sensing elements that are not on a same straight line, the positions of the position sensing elements can be determined in the virtual environment, and thereby, the position and facial direction that the face towards of the head in the virtual environment;

2) determining the images of the virtual environment according to the position and facial direction of the head in the virtual environment.

2. The panoramic system refers to: in the virtual environment, the images of the virtual environment cover all the vision range of the user, and the user only can see the scene of the virtual environment and can not see the scene in the real world. Particularly, the system refers that the user wears a 3D glasses, and the screen of the glasses and the images of the virtual environment cover all the vision range of the user.

3. The positioning system satisfies that the imaging position of the self-role in the user's eyes is the same as the position where the user stays, and the movement of the user's body is synchronizing with the movement of the self-role, when the user what to see his/her body, he/she can see the actions he/she acts in the virtual environment.

The Advantage of the Above Technology Schemes

If the user performs the micro-actions, the invention can control the virtual role to enlarge the micro-action, and the enlarging proportion can be different, namely the instantaneous gesture of the user is different from that of the virtual role, and the gesture change situations of the user and the self-role are also not quite equivalent. Thus greatly relax the operation space requirement of the user, namely, "the contact parts of the virtual role and the virtual environment" and the "contact parts of the user and the operation space" can be different. Especially, the "the user's parts supported by the operation position" and "the virtual role's parts supported by the virtual environment" can be different, for example, when the user sits on the operation position to control the virtual role to perform the step action, "the user's parts supported by the operation position" is a buttock of the user, but the "the virtual role's parts supported by the virtual environment" is a sole of the virtual role.

Simultaneously, "the force that the user acts to the operation position" can be different from "the force that the virtual role acts to the virtual environment". When the self-role perform one action to act force to the virtual environment, thereby to make the self-role generates displacement, the user does not act the force to the environment where the user stays, or the operation force for controlling the operation platform is not enough to overcome the limitation of the operation platform to the user's body. Therefore, no matter how many displacements the virtual role generates, the user can controlling the virtual role while not leaving away the operation platform. For example, if the user sits on the bed to control the virtual role to step, the user only needs to slightly incline the upper body and swing the two feet on the bed, these actions cannot change the position of the user on the bed.

Because when the self-role do any movement and the generates any displacement in the virtual environment, the use does not need to leave the operation position, the system need not limit the movement space and movement form to satisfy the requirement of operation space to the user's body (supposing the system opens the limitation to the movement space and movement form of the self-role, the situation that the user leaves away from the platform or impacts the wall is easy to happen if the traditional technology is used, the situation that the user leaves away from the platform or impacts the wall will not happen if the technology of the present technology is used).

Because the user need not leave away from the operation position, the system can control the virtual role to perform any actions while need not limit the type, number, and range of the action. Further, during the operation process, the user can lying or siting, therefore, the user can freely operate the virtual role for a long time, and the operation can not stopped because of fatigue. The system of the invention fit for different types of people, any people capable of moving can perform the man-machine interaction by the technology disclosed in the present invention.

Due to the user controls the self-role by the micro-action, the self-role can perform the actions which can not be performed in the really environment, for example, the user can control the self-role perform a back bend action as shown in FIG. 3 while performing a punch action.

The "action enlarging system" disclosed in the present invention enable the user control the self role in the virtual environment to do any actions while the user need not leave away from the control platform or move a little distance, further enables the user does the operation in the same operation platform during the operation process and easy to achieve that the kinetic parts of the user keep identical with the virtual action parts of the virtual role in the virtual environment, thereby the user is easy to operate.

The "selecting method" and "combination method" of the present invention can achieve the number of virtual action parts of self-role is bigger than the number of the position sensing points, for example, the disabled person can control the parts of self-role which the disabled person lost to move freely.

Further description of the invention is described below in conjunction with the company drawings and the specific embodiment.

a top view of a mixed mode filter (without cover) in accordance with an embodiment.

Figure 1:
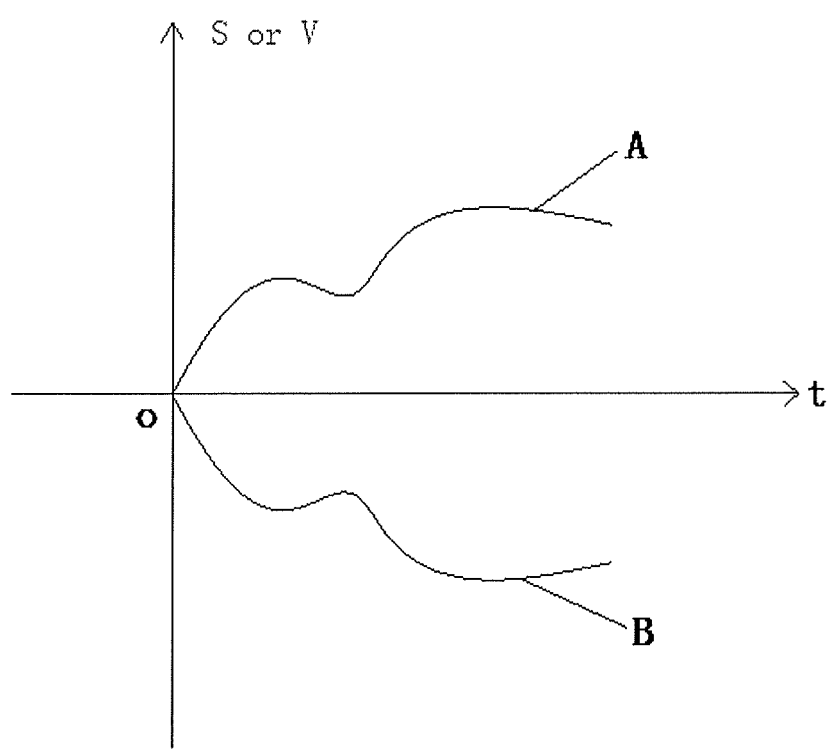
FIG. 1 is a vector action time diagram of a same vector action of the scene where the self-role stays and the head of the self-role in the virtual environment, wherein t represent time, V represents volume, S represents displacement, a curved line A is a time diagram of the volume vector action or the displacement of the scene where the self-role stays; a curved line B is a time diagram of the volume vector action or the displacement of the head of the self-role.
Figure 2:
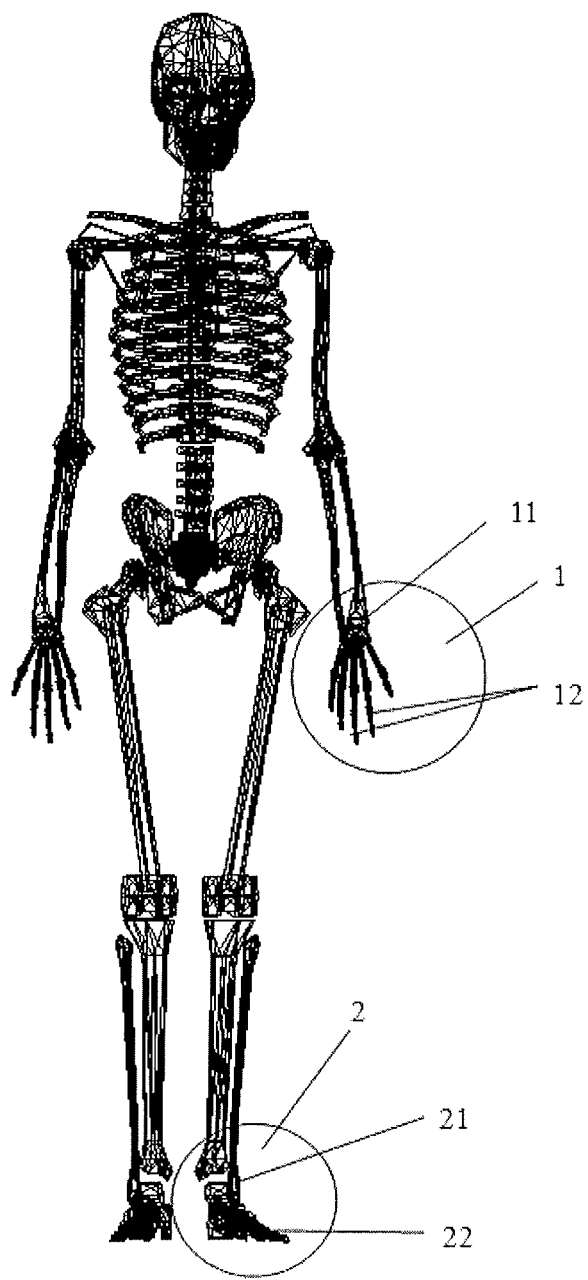

FIG. 2 is schematic diagram of joints of a user.

Figure 3:
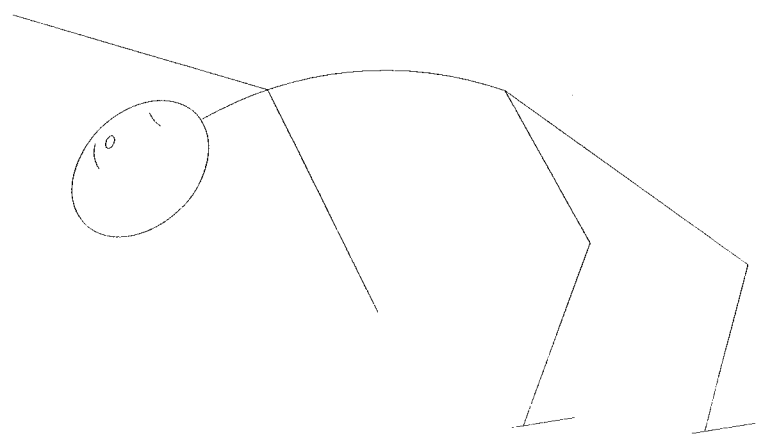

FIG. 3 is a schematic diagram of virtual permission actions.

Figure 4:
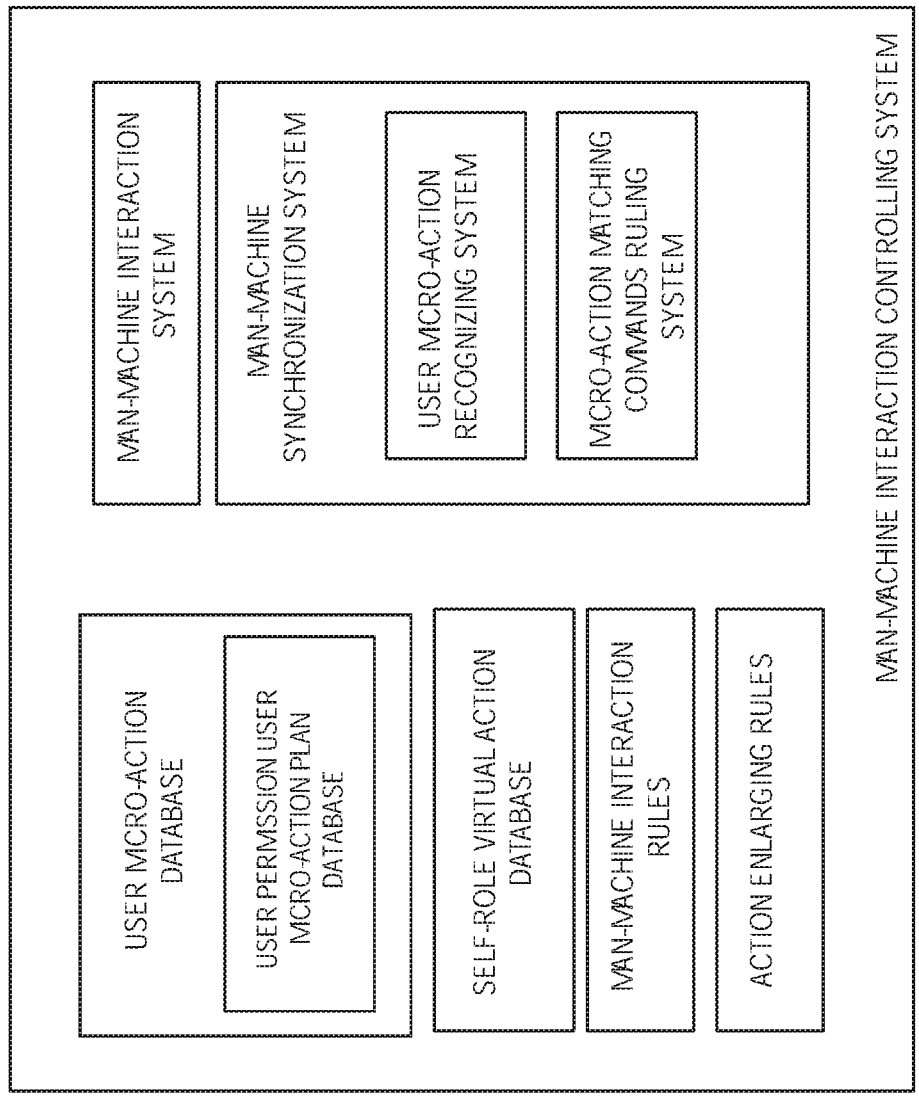

FIG. 4 is a diagram of a man-machine interaction controlling system according to one embodiment of the invention.

Figure 5:
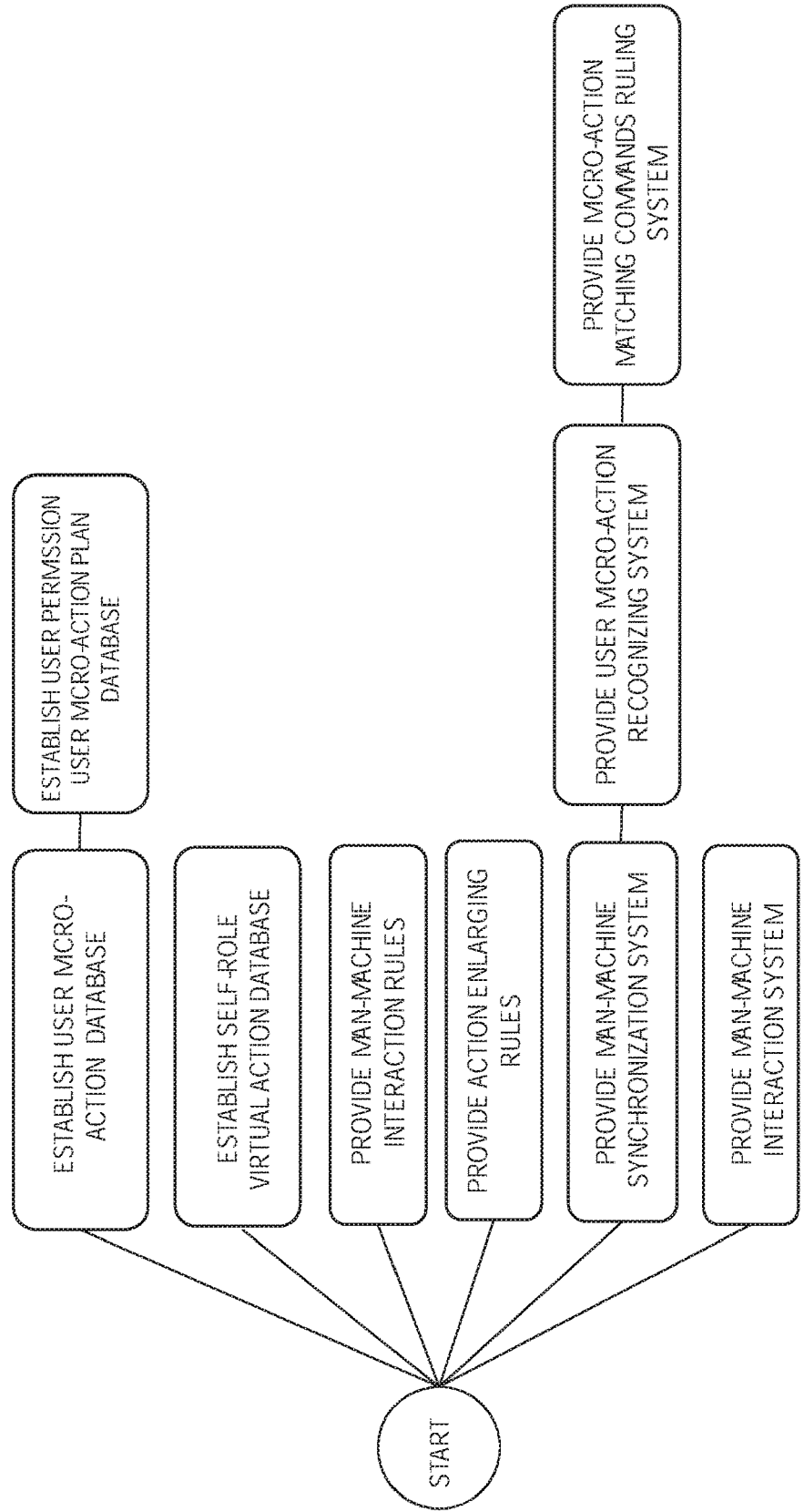

FIG. 5 is a diagram illustrating how the man-machine interaction controlling system in FIG. 4 is created.

Figure 6:
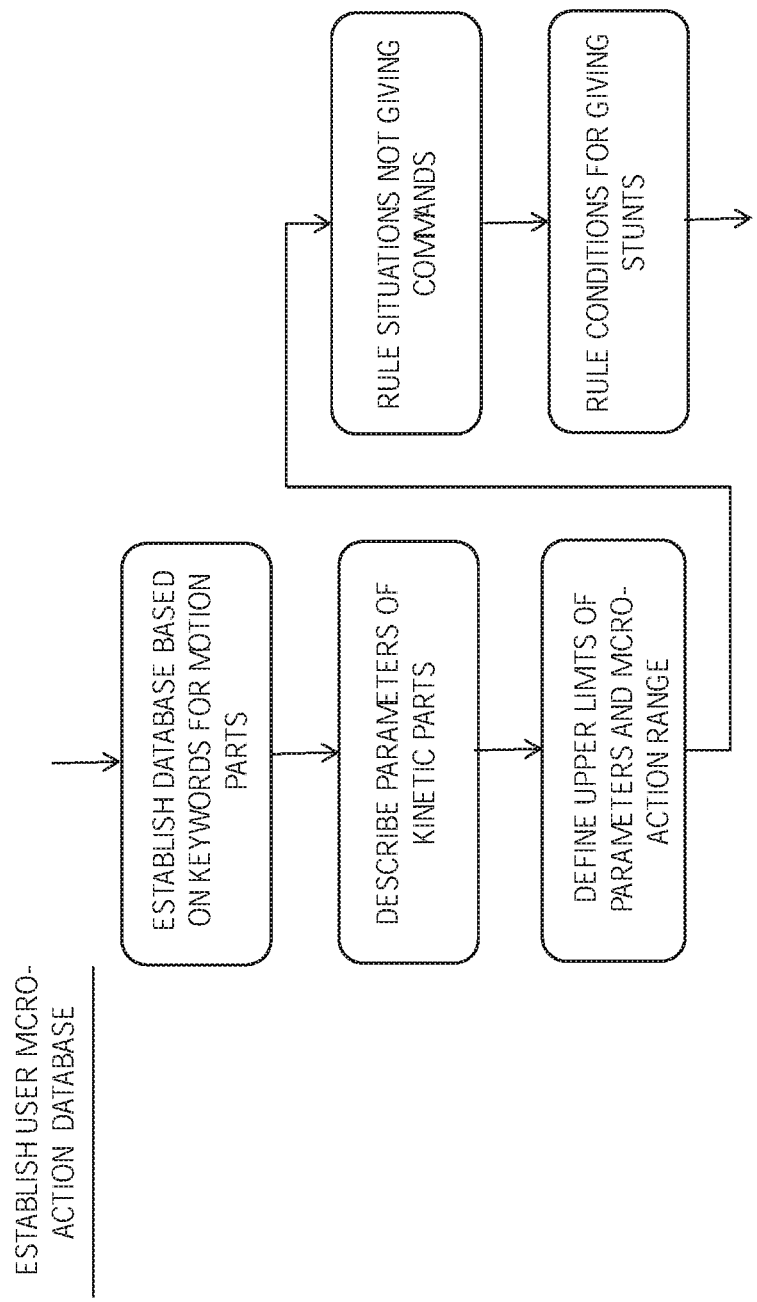

FIG. 6 is a float chart illustrating the process of creating the user micro-action database including the user permission user micro-action plan database.

Figure 7:
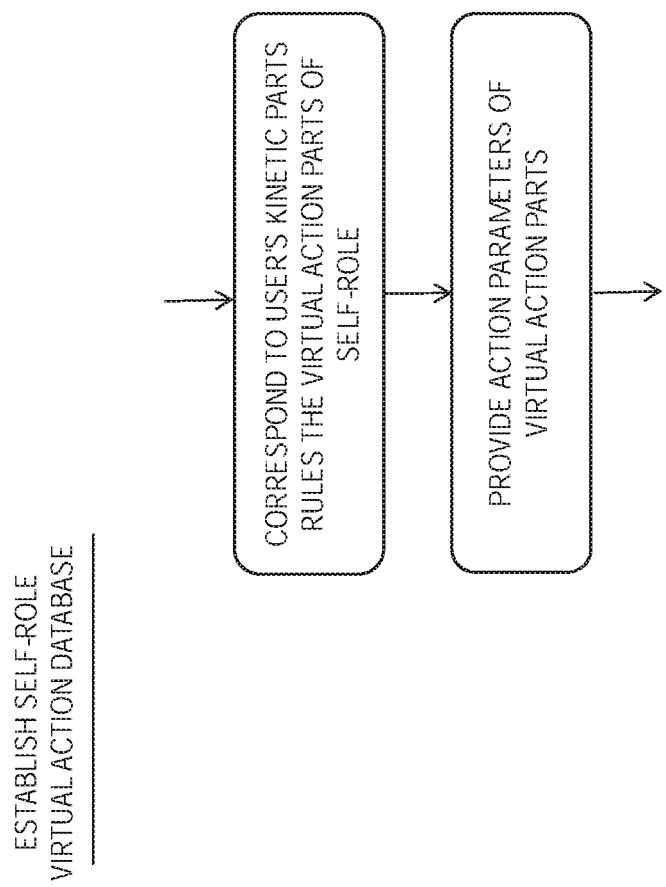

FIG. 7 is a float chart illustrating the process of establishing the self-role virtual action database.

Figure 8:
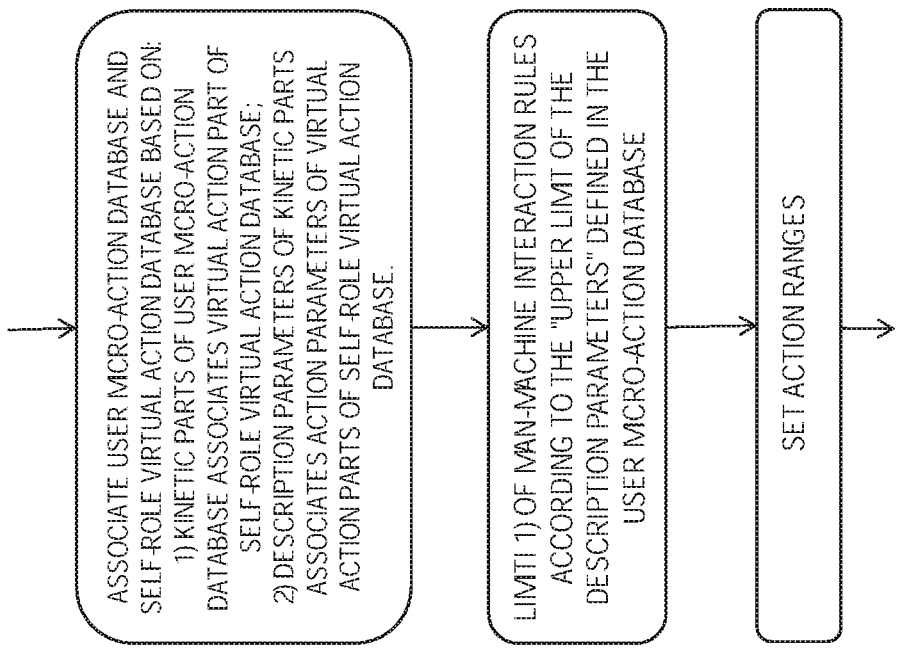

FIG. 8 is a float chart illustrating the process of creating the man-machine interaction rules and the action enlarging rules.

Figure 9:
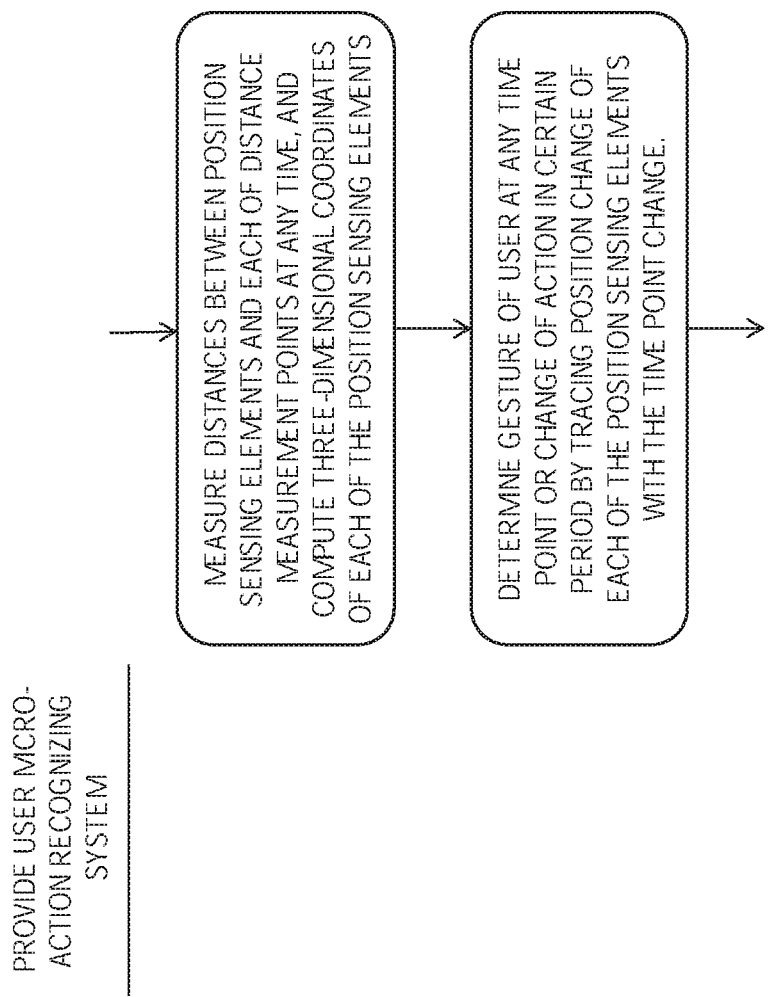

FIG. 9 is a float chart illustrating the process of creating the user micro-action recognizing system.

Figure 10:
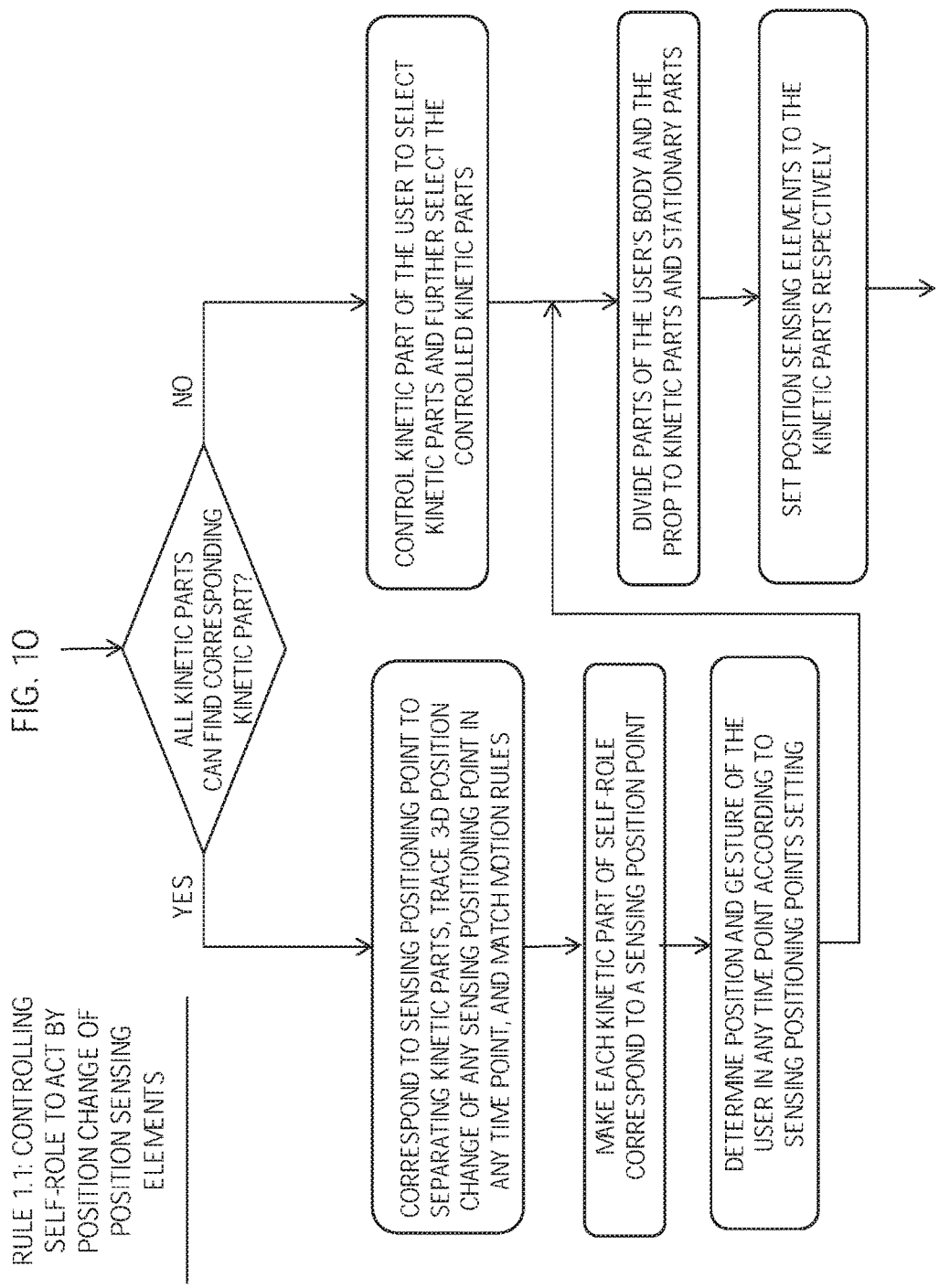

FIG. 10 is a float chart illustrating the process of implementing Rule 1.1 of the micro-action matching commands ruling system.

Figure 11:
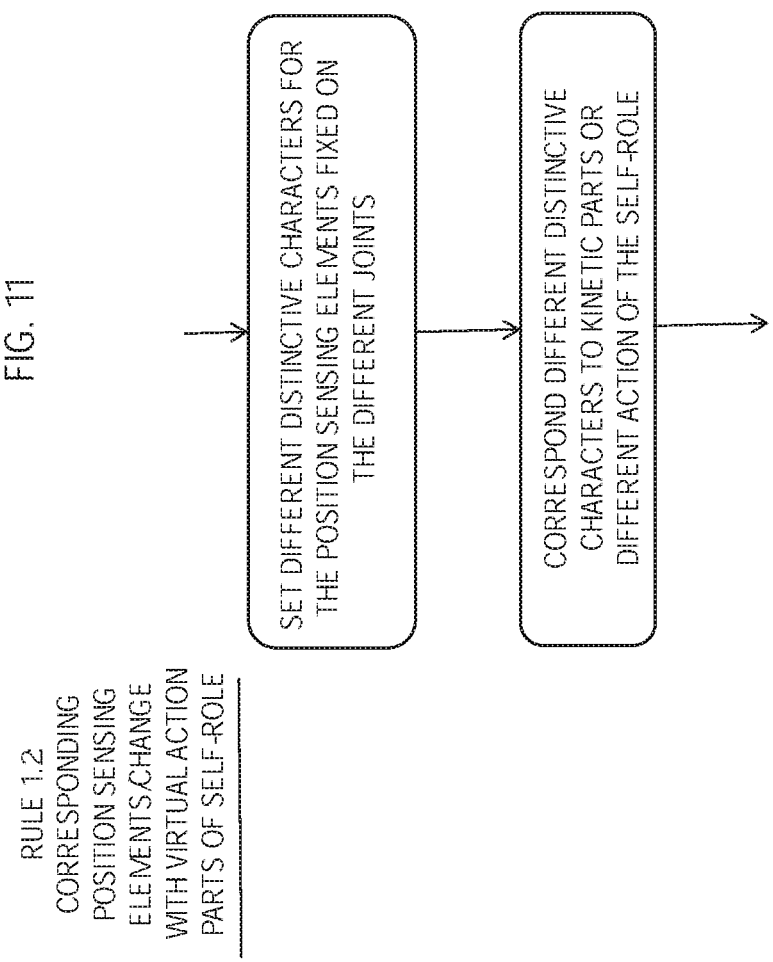

FIG. 11 is a float chart illustrating the process of implementing Rule 1.2 of the micro-action matching commands ruling system.

Figure 12:
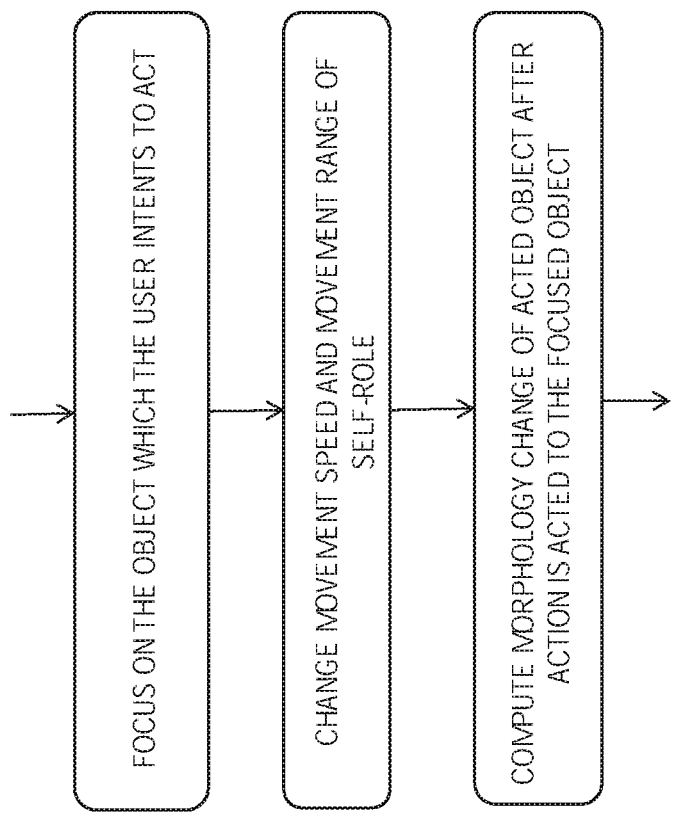

FIG. 12 is a float chart illustrating the mechanism of the man-machine interaction system when the man-machine interaction is triggered by the self-role.

Figure 13:
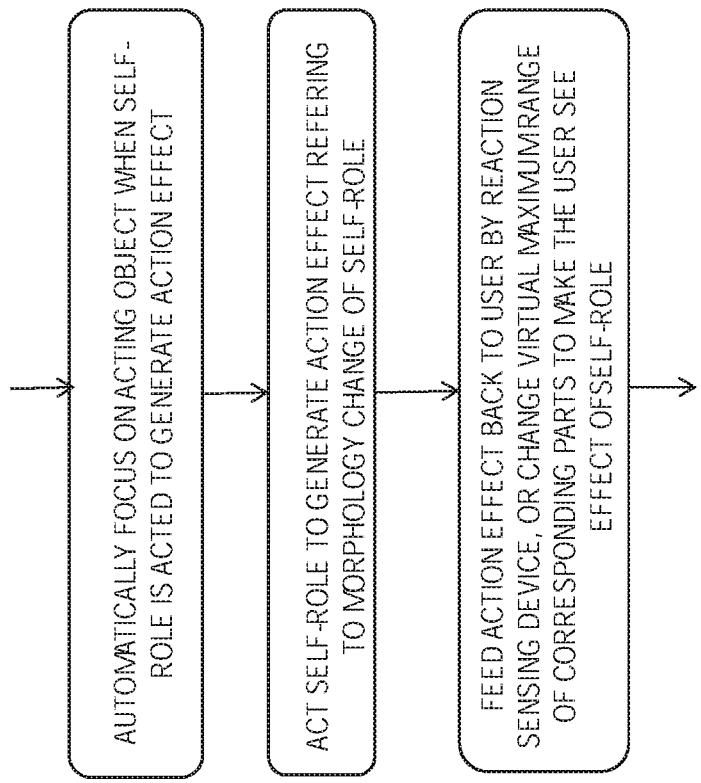

FIG. 13 is a float chart illustrating the mechanism of the man-machine interaction system when other objects of the virtual environment causes the self-role to interact passively.

Figure 14:
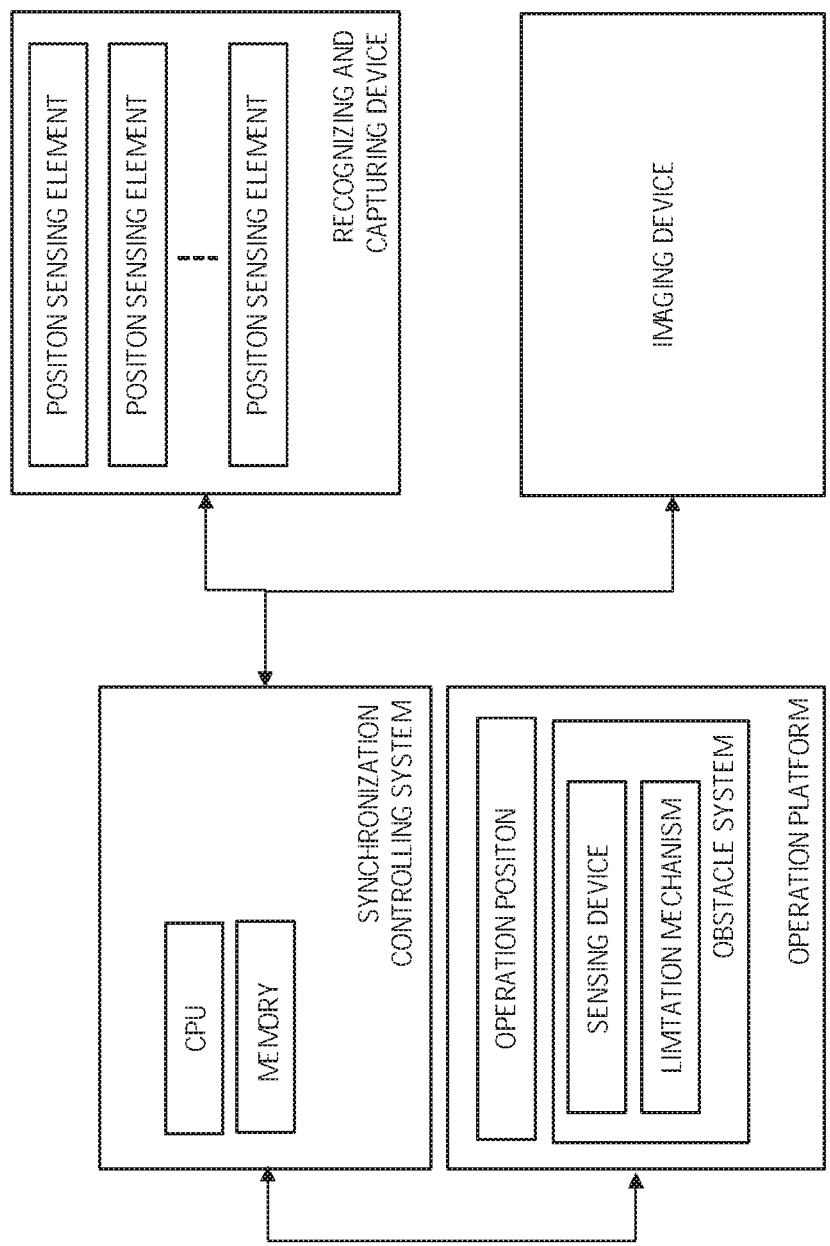

FIG. 14 is a diagram illustrating the hardware components of a man-machine interaction controlling system in one embodiment of the invention.

DETAILED DESCRIPTION OF THE PREFERRED EMBODIMENTS

A First Embodiment, a Method for Controlling Man-Machine Interaction

The method for controlling man-machine interaction establishes a user micro-action database and a self-role virtual action database, and provides action enlarging rules and man-machine interaction rules, as illustrated in FIG. 4 and FIG. 5.

The user micro-action database further includes a user permission user micro-action plan database, as illustrated in FIG. 4.

1. The User Micro-Action Database (as illustrated in FIG. 6):

1.1) Establishing database based on keywords of a head, a neck, a wrist, upper arm, a lower arm, a hip, a upper leg, a lower leg, a palm, and a sole to determine motion part of self-role action capable controlled on a user's body;

1.2) Defining description parameters of the kinetic part, including displacements, angle varying values of adjacent parts, and moving speeds, to rule the form of commands given by the kinetic parts;

1.3) Defining upper limit of the description parameters, determining upper limit of micro-action range to ensure user can continuously perform any controlling actions without leaving a controlling position.

2. The User Permitted User Micro-Action Plan Database (please refer to FIG. 6)

2.1) Ruling situations not giving commands;

2.2) Ruling conditions for giving stunts, namely when user acts qualified action or action group, the self role performs stunts action, especially referring opening authority of ruling the conditions to make different users rule the conditions according to their personalities.

3. The Self-Role Virtual Action Database (as illustrated in FIG. 7)

3.1) corresponding to user's kinetic parts rules the virtual action parts of the self-role;

3.2) action parameters of virtual action parts: displacement, speed, strength; for determining enlarging times of the action range of the virtual action of the part to the action range of the action of the kinetic part of the user.

4. Man-Machine Interaction Rules (as illustrated in FIG. 8)

Associating the user micro-action database and the self-role virtual action database based on the following relation:

4.1) the kinetic parts of the user micro-action database associates the virtual action part of the self-role virtual action database;

4.2) the description parameters of the kinetic part of the user micro-action database associates the action parameters of virtual action parts of the self-role virtual action database.

5. Action Enlarging Rules (as illustrated in FIG. 8)

5.1) Limiting article 4.1) of the man-machine interaction rules according to the "upper limit of the description parameters" defined in the user micro-action database.

5.2) setting the largest action range of any permission action performed by the user or the virtual props to M, setting the largest action range of corresponding permission action performed by the person or object in the corresponding virtual environment is N, setting the action range of the permission action performed by the user or the virtual props at the time point is Mt, setting the action range of corresponding permission action performed by the person or object in the virtual environment is Nt, thereby the system satisfy: if Mt≥M, then Nt=N; if Mt<M, then N>Nt>Mt.

6. In Order to Ensure Synchronization of the Man-Machine Interaction, the Embodiment Further Provides a Man-Machine Synchronization System (please refer to FIGS. 4 and 4):

The man-machine synchronization system includes a user micro-action recognizing system and a micro-action matching commands ruling system, as illustrated in FIGS. 4 and 5.

6.1) The user micro-action recognizing system rules the kinetic parts and un-kinetic parts on the user body or props and setting position sensing elements including distinct characters on the different kinetic parts respectively, establishing a virtual three-dimensional coordinates, and fixes a distance measurement device on three or more than three known coordinate points which are not on the same straight line, the three or more than three known coordinate points fixed distance measurement device are distance measurement points. As illustrated in FIG. 9, the particular method refers to the following description:

a) measuring the distances between the position sensing elements and each of the distance measurement points at any time, and then computing the three-dimensional coordinates of each of the position sensing elements;

b) determining a gesture performed by the user at any time point or the change of the action in a certain period by tracing the position change of each of the position sensing elements with the time point change.

The micro-action recognizing system of the embodiment is aimed at tracing the movements of the limbs of the user in a real time point and also can set two or more than two position sensing elements on any kinetic part, wherein the coordinates of at least two points set position sensing element on the x, y, and z axis are all different, and thus the horizontal rotation angle and vertical rotation angle of the kinetic part in a certain period can be determined.

6.2) the micro-action matching commands ruling system; makes the sensing positioning point on the limbs generate a displacement change which based on a predetermined rule by controlling limbs action of the user, and thereby matching the action plan of the self-role, it includes A Rule 1:

The rule 1 includes "a method for controlling a self-role to act by position change of position sensing elements" and "a method for corresponding position sensing elements or the change thereof with the virtual action parts of the self-role"

A rule 1.1 (as illustrated in FIG. 10): a method for controlling a self-role to act by position change of position sensing elements.

Defining N separating kinetic parts, such as A1, A2, ... An, for the self-role in the virtual environment, and defining m types of permission action, such as Ax1, Ax2, ..., Axn, for any one, such as Ax, of the N separating kinetic parts, Axx is any one of the m types of permission action and can be controlled according the two situations described below.

The first situation, namely each of the N kinetic parts can correspond to one kinetic part on the user's body.

1) where n sensing positioning points A', such as A1', A2', ... An', correspond to n separate kinetic parts on the user's body, tracing the 3-D position change of any one sensing positioning point, such as Ax', of the n sensing positioning points A' at any time point t, and matching one of m motion rules Ax1', Ax2', ... Axm', wherein Axm is any motion rule of m motion rules.

2) making each of the separate kinetic parts of the self-role correspond to one of the sensing position points A' on user's body, the permission action Axx of any one of the separate kinetic parts Ax of the self-role is started only when the permission action Axx acts at the sensing positioning point Ax' by the action rule Axx', for example, the displacement change of Ax changing with the time point change corresponds to the displacement change of the Ax' changing with the time point change, for another example, a strength of the Ax corresponds to a bending degree and jiggling frequency of the joints, the condition for the strength of the Ax reaching a maximal value is that the range of Ax' of the user reaches a maximal value; in addition, Ax further should consider a degree of tension, rapid movement, and performing time point of the corresponding Ax to operate the virtual environment more naturally and make the movement of the self-role comply with the laws of nature.

3) the joints of the present embodiment are aimed at determining the position and gesture of the user in any time point according to the sensing positioning points setting on the user's body. The joints satisfy this aim are taken as example, such as three joints of each fingers, joints of wrists, joints of elbows, joints of shoulders, any three points on the head which are not on one straight line, one joint of each toe, joints of ankles, and center of calf, thighs, and a spine.

The second situation, namely when not all the N kinetic parts can find the corresponding kinetic part on the user's body.

Supposing there are several kinetic parts Ay can not find corresponding kinetic part on the user's body, first, controlling the kinetic part of the user select s kinetic parts such as Ay1, Ay2, ..., Ays, and further selects the controlled kinetic parts Ay through one of a selecting method and a combination method. The selecting method refers to after the kinetic parts Ay' determines the corresponding virtual action parts Ay, the kinetic parts Ay can control the virtual action parts Ay separately. The combination method refers selecting the different kinetic parts to control using one command or other kinetic parts when the kinetic part needs to be changed, for example, the arms of the user can select the arms and wings of the self-role to control, if the kinetic part is the joint of toe, when the toe is curled, the wing is controlled, the one command refers to when the users gives a command satisfy the requirement, the system will pops up a selecting window and user can displace or determine the corresponding virtual action parts.

In addition, the method for controlling a self-role to act by position change of position sensing elements further includes dividing the parts of the user's body and the prop to kinetic parts and stationary parts, and setting position sensing elements to the kinetic parts respectively, wherein, the props correspond to the objects or tools in the virtual environment, and thereby, when the props is operated, the objects or tools in the virtual environment can also be operated, that is to say, the position sensing elements are used to control the things (persons or objects) in the virtual environment.

Rule 1.2 (as illustrated in FIG. 11), namely a method for corresponding position sensing elements or the change thereof with the virtual action parts of the self-role:

setting different distinctive characters for the position sensing elements fixed on the different joints, and corresponding different distinctive characters to the kinetic parts or different action of the self-role.

The distinctive characters are the different density or rules of painted points disposed on the position sensing elements, if the position of the position sensing element, the density of the painted point on which is d and the rules of the painted points on which is rule 1, is changed, certain kinetic part of the self-role performs the corresponding permission action. The density and rules of the painted point can be achieved by stamping.

A Rule 2: A Rule for not Giving Command

The rule in the present embodiment is preferably the rule for not giving command, but the rule for giving command is also included in the embodiment.

The sensing position points of the embodiment adapted to the following two method.

1) taking the paint which can be detected as the sensing position points and painting the sensing position points on the sensitive point on the muscle, obtaining a range of muscle tension and speed of movement of the kinetic parts by analyzing the movement state and the position change of the position sensing elements, and thereby concluding the intend intention of the user according to a fine adjusting mechanism and then giving a command to things in the virtual environment.

2) Fixing the sensing position points on the kinetic parts of the wearable controlling device, after the user wears the device, the actions of the parts of the body can control the sensing position point generates corresponding command, thereby, the user can see the actions of himself/herself or the tools operated by himself/herself in the virtual environment. The wearable controlling device can shortage the preparing time point before the user enters into the virtual environment and simplify the preparing process, and therefore the user can enter into the virtual environment more conveniently.

The above two methods are not limited to applied to an action enlarging system, and especially adapted to the virtual environment play which does not requiring displacement of the user's body, such as car racing virtual environment.

In the embodiment, the wearable controlling device further can be implanted a controller to make an operating unit including in the wearable controlling device sense the vector change (e.g. displacement, speed, direction) generated by the sensing position points. By combining with a sensing positioning points system, the wearable controlling device can be simplified, and only needs mechanism construction and does not need to be provided with the electronic system. Because the user's body only performs the micro-actions in the virtual environment, the wearable device almost no damage, thus extends the service life of the device while avoiding to the use's body hurt caused by the short-circuit of the electronic system.

In the embodiment, the wearable controlling device includes palm sets, arm sets, head sets, sole sets, leg sets, buttock sets, and waist set. Each of the above sets one or more than one sensing positioning points.

The device further needs to satisfy the following requirements: setting one or more than one sensing positioning points on the three joints of each fingers, the joints of wrists, the joints of elbows, the joints of shoulders, any three points on the head which are not on one straight line, one joint of each toe, joints of ankles, and center of calf, thigh, and a spine.

The device aims at determining the position and gesture of the user at any time point according to the position of the sensing position points setting on the user's body.

The arrangement of the sensing position point of the device is limited to the above described arrangement.

7. For Improving the Bionic Effect, the Embodiment Further Provides a Man-Machine Interaction System.

The system includes a reaction sensing device and an action sensing device. The system is mainly used to correct a ratio Mm/Nm of a user's maximum permitted micro-action range Mm to the self-role's maximum permitted micro-action range Nm, and make the ratio Mm/Nm is bigger than a default value, namely when the reaction sensing device and the action sensing device is working, self-role's maximum permitted micro-action range Nm is reduced proportionally according to the following reasons.

7.1) If the man-machine interaction is triggered by the self-role, it is performed by the following method (as illustrated in FIG. 12):

7.1.1) Focusing on the object which the user intents to act;

A First Method

Using a user's eyes positioning device to focus the object which the user intents to operate, specifically, when the gaze direction of the user passes through an object and the action direction of the limb or prop directs to the object, the eyes positioning device gives a command that the limb or prop will act to the object, and then the system sends the command to the self-role to focus on the objet. Wherein, the technology for tracing user's gaze can use the technology disclosed in a patent application file numbered CN 201110411809.X and titled "method for recognizing the gaze direction during user looking an object", which discloses a method to identifying the space eyes view, one or more than one location element is disposed on the eye lid capable of contacting with the eye ball, the orientation of the retina is determined by detecting the motion of the location element. The method comprises the step: determining the coordinate and orientation of the face in the environment, or determining the coordinate and orientation of a body part that can directly determine the position and orientation of the face in the environment; determining the relative position of the eye ball in the face, and then determining the coordinate of the eye ball in the environment. The method of the present invention can precisely determine the rotation of the eye ball and the real-time orientation of the pupil, thus determining the object space eyes view, the method costs low, and there is no load to the eyes. Alternatively, the technology for tracing user's gaze can use any other known technology, such as a patent file numbered CN 02829315.0 and titled "tracing the direction and position of rolling eyes", which discloses methods and systems for tracking a position and torsional orientation of a patient's eye. In one embodiment, the present invention provides methods and software for registering a first image of an eye with a second image of an eye. In another embodiment, the present invention provides methods and software for tracking a torsional movement of the eye. In a particular usage, the present invention tracks the torsional cyclorotation and translational movement of a patient's eye so as to improve the delivery of a laser energy to the patient's cornea.

A Second Method

Using an eyes image capturing device to determine the main object which the user focuses on, wherein the eyes image capturing device can use the known technology such as a patent file numbered CN 200610072961.9 and titled "eyes image capturing device".

7.1.2) After the action is acted to the focused object, the movement speed and movement range of the self-role must be changed because of the reaction acting on the self-role. The system adjusts the acted loads by the reaction sensing device, or changes the virtual maximum range of the corresponding parts, or changes the enlarging times of the actions of the virtual action parts to the kinetic parts to make the user to feel the change of the "action speed" and "action range" after the self-role acts to one object.

7.1.3) Computing the morphology change of the acted object after the action is acted to the focused object, the morphology change includes a shape change (e.g. gesture change, shape change that can not be recovered, especially refers to damage), and a kinetic energy change (kinetic energy value+kinetic energy direction).

7.2) In the man-machine interaction process, when the other object of the virtual environment acts to the self-role to make the self-role interact passively, as shown in FIG. 13, the following step are performed:

7.2.1) automatically focusing on the acting object when the self-role is acted to generate an action effect;

7.2.2) the self-role is acted to generate an action effect refers to the morphology change of the self-role after the action is acted to the self-role; the action effect is feed back to the user by the reaction sensing device, or changes the virtual maximum range of the corresponding parts to make the user to see the effect of the self-role, and thereby generates illusions alike or similar to the reaction sensing device by the vision.

Taking an Example to Describe

If the self-role intends to attack a game role, first the attacked object should be focused, when the self-role gives a punch to the moving arm of the attacked object, the reaction of the arms of the attacked object is received. Particularly, no mater whether the attacked object blocks, based on the action and reaction principle, if the self-role touch the attacked object, the self-role certainly receives the reaction. If the attacked object blocks, the self-role receives the action of the blocking arms of the attacked object, and then the effect of the reaction sensing device is added.

Particularly it should be referred:

1) For ensuring the efficiency of the action enlarging system, the performed condition of the permitted action of the self-role is not the position of the sensing positioning point at a certain time point, but the position change relative to the previous time point.

2) the position of the distance measurement points are fixed or the coordinates of the distance measurement points can be determined by computing;

3) In some virtual environment, in order to reduce the occupancy of the computer resource, a few of particular actions are defined for the self-role, in such situation, the action or combination action of some parts of the user can control the self-role to do a successive permitted action.

4) The action enlargement system and an action positioning point controlling system can be used together or used separately.

5) The invention further includes a voice controlling system which enable the user give commands by the voice to control the permitted actions of the self-role and the basic operations of the virtual environment, such as, exiting, saving. The system further includes voice recognizing system for recording user's voices and matching commands for the recorded user's voices.

Other Specification:

After ready, the user will find the position where he/she exit the virtual environment last time and this position is taken as the start position for the scene change caused by the following actions.

The virtual environment permits the self-role has deformation ability. After the self-role is deformed, if the number of the controlled parts of the self-role is greater than the number of the joints of the user, the "selecting method" can be used. When a selecting commands action is acted, a certain joint is selected to control the kinetic parts of the self-role in the virtual environment. Further, the "combination method" also can be used, namely, when the two or more than two joints performs a particular action simultaneously, the same effect can be achieved.

The virtual environment further permits the user has super abilities such as telekinesis. The starting condition for giving such command is the sensing positioning points on user's arm are all on a straight line, the sensing positioning points on the palm are forms a ungual shape and extend toward the object, determining the attraction power in the virtual environment needs to predefine the maximum value of the attraction power of the self-role first. The condition for predefining the maximum value of the attraction power is the jiggling frequency of the fingers. The attraction power is reduced with the reduction of the jiggling frequency.

When receiving the intend of the user, the virtual environment will computing attraction power and comparing the difficulty to attract the object, if the gravity of the object is too great or the attraction power between the object and the place where the object place is too great, the strength of the clutch action should be added, thereby the curved degree of the finger is more greater, and the jiggling of the fingers is strengthened, thus causes the jiggling of the sensing positioning point on the fingers are strengthened, thereby the computer can receive the information about that the attraction power of the user is strengthened, and further can determine whether the attraction of the object is completed.

The way for corresponding the position sensing elements and the parts that the position sensing elements controlled. If each of the joints corresponds to one position sensing elements, in the virtual environment with a great number of permitted actions, the user should prepare for a long time to enter into the virtual environment. For this reason, the invention provide the wearable controlling device. Only needing wears the gloves, foot sets, supporter sets and headset, the user can controls the sensing position points covered on each of the joint, therefore, the wearable controlling device is more practice.

Because the action enlarged method is used, the body of the user does not corresponds to the limbs position and gesture of the self-role, therefore, it can not be determined by the position of the sensing positioning points alone, but the position and direction of the head (especially the eyes) of the user and the self-role is the same. Then how to explain the coordinates of the user can be determined in the virtual environment? First, the vision of the user is obtained by the glasses, so the coordinates of the glasses in the virtual environment can be determined. Because the relative position between the eyeball and the glasses is invariable, the coordinates of the eyeball of the user in the virtual environment can be determined.

A Second Embodiment, a Virtual Device

The virtual device includes a positioning system, a panoramic system, a scene moving system, action concluding system, and action enlarging system.

A. The action concluding system: the known technology, such as patent application file numbered 97198214.7, can be used.

B. The action enlarging system: referring to the detailed description in the first embodiment.

C. The panoramic system

The panoramic system refers to in the virtual environment, the images of the virtual environment cover all the vision range of the user, and the user only can see the scene of the virtual environment and can not see the scene in the real world.

Particularly, the system refers that the user wears a 3D glasses, and the screen of the glasses and the images of the virtual environment cover all the vision range of the user. This technology can refer to the known technologies, such as a Chinese patent file numbered CN 200810066897.2 and titled "mobile video glasses integrated CMMB receiving module".

D. The positioning system

The positioning system satisfies that the imaging position of the self-role in the user's eyes is the same as the position where the user stays, and the movement of the user's body is synchronizing with the movement of the self-role, thereby, when seeing the body of the self-role, the user may have an illusion that the body of the self-role is the real body of himself/or herself. The method for synchronizing the movement of the user's body and the movement of the self-role's body determines the action of the user by the action recognizing system, determines the content of command given by the user, and then controls the movement of the kinetic parts of the self-role.

E. The scene moving system

The scene moving system using the reversible actions of the scene where the self-role of the virtual environment is in to make the user has an illusion that his/her body is moving or changing (enlarging/reducing the body or varying shape of body). The method for determining the scene wherein the self-role is in includes:

1) directly fixing positioning element, which can be moved simultaneously with a head, on the head of the user, the positioning element defines three position sensing elements that are not on a same straight line, the positions of the position sensing elements can be determined in the virtual environment, and thereby, the position and facial direction that the face towards of the head in the virtual environment;

2) determining the images of the virtual environment according to the position and facial direction of the head in the virtual environment.

The fixed position of the positioning element on the head should satisfy the requirement that the positioning element must move simultaneously with the movement of the head, further, the positioning element also can fixed on the tools wear on user's head.

In the embodiment, the synchronization relation used in the face of the user and the self-role can also use the action enlargement system.

In the embodiment, in order to make the virtual environment more lifelike, the device further includes one or more of a olfactory system, a tactile system, a physical fatigue random obstacle system.

The physical fatigue random obstacle system can combine with wearable controlling device, such as connecting a push mechanism to the sole set, or placing a hand-held tool inside the palm set.

The obstacle system includes a reaction sensing device and an action sensing device. The action sensing device is required: when any object in the virtual environment acts to one or some parts of the self-role, the obstacle system acts to the corresponding parts of the user according to the characters of the action of the object. The reaction sensing device is required: when the self-role acts to any object of the virtual environment, the obstacle system concludes the reaction parts and reaction effect to the self-role according to the action characters and the state at that time of the object, and the obstacle system acts to the corresponding parts of the user proportionally. The obstacle system changes the load which the reaction sensing device and the action sensing device put on the user according to the physical fatigue degree or the biggest motion ability of the self-role.

Referring an Example for Further Description (please refer to FIG. 14 for the system in the example)

Before simulating the virtual environment, the user should be fixed on a operation position (e.g. bed), when user move any limb on the body, the self-role in the virtual environment performs an action. Thus arrangement is aimed that user can operate the self-role in the virtual environment at the same operation position when acting any action. After acting, the position where the body stays does not change, thereby reducing movement space of the user.

The user is lying on or siting on an operation platform, the obstacle system limits the biggest movement range of the limbs of the use's body, such as a sole device elastically contacting the foot of the user, an arm limited device is put around the arm of the user by the way of interference fit.

The obstacle mechanism is place on the parts of the body of the action permitted by the user, in the common situation, the obstacle mechanism keeps a certain distance (called free space) from the user's body to enable the parts of the user's body to do any micro-motion without effect of the obstacle mechanism in the situation that the parts of user's body do not contact the obstacle mechanism. The obstacle mechanism defines an elastic load moving area (called load space). When the user's body contacts the obstacle mechanism and goes on moving to the direction of the elastic force, the corresponding parts of the body work by overcoming the elastic force. The functions of the obstacle mechanism are:

1) the sum of the movements of the free space and the load space corresponds to the biggest range of the permitted micro-action of the user;

2) when the body of the user acts to the obstacle mechanism and the action of the body fit for the command capable recognizing by the computer, the self-role performs the virtual permission action continuously, such as turning around continuously;

3) if the man-machine interaction is caused by the user, the obstacle mechanism does an reaction to the user;

4) if the objects in the virtual environment acts to the self-role of the virtual environment, the obstacle mechanism reduces the free space and acts to the body of the user;

5) if the movement ability value of the self-role is improved, the load of the obstacle mechanism is reduced;

6) if the movement ability value of the self-role is reduced, such as fatigue, the load of the obstacle mechanism is improved;

The video device of the invention is not limited to the device obtained image by the eyes, the patent file numbered CN 00820024.6 and titled "implanting element implanted to the human body and a manual optical system discloses a method for enabling the brain to obtain the images not by the eyes.

The Third Embodiment, a Playing Method is Provided

A playing method provides the super ability to the self-role, includes the steps of:

1) creating the virtual permission actions of super ability of the self-role excepting the ability for enlarging the stamina of the user.

2) Tracing the change of the permitted micro-action of the user and determining the acted object of the virtual permission action of super ability of the self-role.

3) Evaluating the evaluation indicators of the super ability of the self-role during performing the virtual permission action of the super ability to make the acted object generate morphology angle proportionally.

The morphology angle of the self-role includes position, shape, state, and matter, wherein the shape includes shape change, change between the liquid state and the granulation state, state change includes: change among the gas state, liquid state, and solid state, and position change includes: change of displacement, movement speed, and acceleration.

The virtual environment of the present invention at least includes one or more of a future environment, a past environment, and dream environment.

The present invention opens the authority to the user to reset the parameters of the object in the virtual environment, thus enables the user to establish, adjust, delete the virtual environment, and thereby, the user can easily realize the virtual object. The present invention far surpasses the traditionally tools.

The Fourth Embodiment, a Man-Machine Controlling Method which is Applied to the Exhibition and Communication of the Space Design and Space Sample, Includes the Steps of 1) modeling 3D model for the space design and space sample;

2) enabling the user to use the man-machine interaction controlling method of the first embodiment to control the self-role to perform the virtual actions in the 3D model modeled for the space design and space sample.

The Fifth Embodiment, a Man-Machine Controlling Method, which is Applied to Shoot a Movie, Includes the Steps of 1) modeling a 3D model for movie scenes 2) enabling the actors to use the man-machine interaction controlling method of the first embodiment to control the self-role to perform the virtual actions in the 3D model modeled in the step 1);

recording the required scenes in the 3D model and the images of the virtual actions performed by the self-role.

The Sixth Embodiment, a Man-Machine Controlling Method, which is Applied to Simulate an Experiment, Includes the Steps of 1) collecting the known laws of nature and establishing algorithm f[x1(x11, x12 . . . x1$n$), x2 (x21, x22 . . . x2$n$) . . . xn(xn1, xn2 . . . xnn)]=y1(y11, y12 . . . y1$n$), y2 (y21, y22 . . . y2$n$) . . . yn(yn1, yn2 . . . ynn), wherein Xn the main element before a reaction, Xnn is the computing parameters of the Xn, yn is the main element after the reaction, ynn is the computing parameters of yn, f is the algorithm formular.

2) enabling the user to control the self-role performs f1 action to the xn in the virtual environment and adjust the xnn value of the xn to the setting value of the user;

4) computing and recording the yn value and ynn value according to the algorithm formular of the step 1).

In the embodiment, if the experiment needs to reflect several times reaction of one law of nature, or several times reaction of several laws of nature, the steps 2)-4) are performed according the requirement.

The experiment method has no the risk of hurting the user while has zero cost and high experiment precision.

The Seventh Embodiment, a Man-Machine Controlling Method, which is Applied to Travel, Includes the Steps of 1) modeling the 3D model to the tourist areas;

2) enabling the user to control the self-role to perform the virtual action in the 3D model of the step 1) using the man-machine interaction controlling method of the first embodiment.

What is claimed is:

1. A man-machine interaction controlling method, wherein a user performs user permitted micro-actions to control a self-role in a virtual environment to perform a virtual permission action plan at an operating position, the method comprises steps of:

1) creating the self-role in the virtual environment to make the self-role have more than one virtual action part;

2) associating corresponding kinetic parts of the user with the virtual action parts of the self-role, determining enlarging times of an action range of different virtual action parts relative to an action range of the corresponding kinetic parts of the user, permitting gestures of the two adjacent kinetic parts of the user to be different from gestures of the associating virtual actions parts of the self-role, further permitting movement of the user and movement of the self-role to be different from each other, further satisfying a condition in which the self-role is not lying or sitting while the user is lying or sitting at the operating position and need not move away from the operating position;

3) the user performing the micro-actions while sitting or lying at the operating position;

4) enabling the self-role to enlarge the micro-action of the user.

2. The man-machine interaction controlling method as claimed in claim 1, wherein
- a maximum action range value M is set for each of the user micro-actions which are performed by the user or a prop,
- a maximum action range value N is set for the virtual actions which are performed by the self-role, where N is less than a movement limit of the corresponding kinetic part of the user,
- supposing the action range of the micro-action by the user at time t is Mt, the action range of the virtual action performed by the self-role is Nt, then if Mt≥M, Nt=N; if Mt<M, N>Nt>Mt,
- further in the virtual environment, the user is always in a same operation position and need not move away from the operating position,
- the method further comprising the steps of:
  1) defining an upper limit of the action range M of the micro-action to ensure the user continuously to perform a controlling action;
  2) limiting a maximum movement range of user's limbs and enabling the limited parts to perform the micro-action completely.

3. The man-machine interaction controlling method as claimed in claim 1, further comprising one or more of the following steps:
  1) acting upon corresponding parts of the user according to an action of an object in the virtual environment when the object acts upon certain parts of the self-role;
  2) determining reaction forces and acting on the self-role to make the action acting on the corresponding parts of the user proportional to the determined reaction effect according to the action and the instantaneous state of the self-role reacting to an object in the virtual environment;
  3) establishing one or more sets of user permitted micro-action plan or one or more sets of virtual permission action plan;
  4) enabling the user only to see a view of the virtual environment and not to see the body of himself/herself;
  5) enabling images of the virtual environment to cover vision of the user;
  6) permitting at least two virtual action parts whose enlarging times are not to have different enlarging times.

4. The man-machine interaction controlling method as claimed in claim 1, further comprising: making the corresponding parts of the user to be acted upon with a load proportional to a load that the user is able to receive according to a physical fatigue degree or a maximum motion ability of the self-role.

5. The man-machine interaction controlling method as claimed in claim 1, wherein
- the controlling method comprises a selecting method and a combination method,
- the selecting method is permitting the user to select other kinetic parts of the user to replace the corresponding virtual action parts of the self-role when the user does not have parts corresponding to the virtual action parts of the self-role,
- the combination method is setting a share part on the user's body to control more than one virtual action part of the self-role when the number of the kinetic parts on the user's body is less than that of the virtual action parts of the self-role.

6. The man-machine interaction controlling method as claimed in claim 5, wherein the combination method further comprises one or more of the following steps:
  1) selecting other virtual action parts by a command or in cooperating with other kinetic parts when the virtual action parts of the self-role is required to switch;
  2) combing the share part with one or more kinetic parts to control the virtual permission action plan together.

7. The man-machine interaction controlling method as claimed in claim 5, wherein the virtual environment comprises at least one or more of
- a future environment,
- a past environment, and
- a dream environment.

8. The man-machine interaction controlling method as claimed in claim 7, wherein the method opens the authority to the user to reset the parameters of the object in the virtual environment to enable the user to establish, adjust, and delete the virtual environment.

9. The man-machine interaction controlling method as claimed in claim 1 wherein
- the method provides a super ability to the self-role, and further comprises the steps of:
  1) creating a virtual permission action plan of super ability of the self-role excepting the ability for enlarging stamina of the user,
  2) tracing the change of the permitted micro-action of the user and determining the acted object of the virtual permission action of super ability of the self-role,
  3) evaluating evaluation indicators of the super ability of the self-role during performing the virtual permission action of the super ability to make the acted object generate morphology change proportionally.

10. The man-machine interaction controlling method as claimed in claim 1, wherein the method, applied to the exhibition and communication of the space design and space sample, comprises the steps of:
  1) modeling a 3D model for a space design and a space sample;
  2) enabling the user to use the man-machine interaction controlling method claimed in any one of the claims 1-4 to control the self-role to perform the virtual actions in the 3D model modeled for the space design and space sample.

11. The man-machine interaction controlling method as claimed in claim 1, which is applied to shoot a movie, comprises the steps of:
  1) modeling a 3D model for movie scenes;
  2) enabling actors to use the man-machine interaction controlling method claimed in any one of the claims 1-4 to control the self-role to perform the virtual actions in the 3D model modeled in the step 1);
  recording the required scenes in the 3D model and images of the virtual actions performed by the self-role.

12. The man-machine interaction controlling method as claimed in claim 1, wherein
- the method is applied to simulate an experiment and comprises the steps of:
- establishing an algorithm such that $f[x1(x11, x12 \ldots x1n), x2(x21, x22 \ldots x2n) \ldots xn(xn1, xn2 \ldots xnn)] = y1(y11, y12 \ldots y1n), y2(y21, y22 \ldots y2n) \ldots yn(yn1, yn2 \ldots ynn)$, wherein Xn is a main element before a reaction, Xnn is the computing parameters of the Xn, yn is a main element after the reaction, ynn is computing parameters of yn, f is an algorithm formula;
- enabling the user to use the man-machine interaction controlling method claimed in any one of the claims 1-3 to control the self-role performs f1 action to the xn in the virtual environment and adjust the xnn value of the xn to the setting value of the user;

computing and recording the yn value and ynn value according to the algorithm formula.

13. The man-machine interaction controlling method as claimed in claim 1, which is applied to travel, comprises the steps of:
1) modeling a 3D model to tourist areas;
2) enabling the user to use the man-machine interaction controlling method claimed in any one of the claims 1-3 to control the self-role to perform the virtual action in the 3D model.

14. A man-machine interaction controlling system, a user performs a user permitted micro-action at an operating position to control a self-role in a virtual environment, wherein the system comprises
an imaging device,
an operating platform,
a recognizing and capturing device for recognizing and capturing the user permitted micro-action plan, and
a synchronization controlling system for controlling the synchronization of the actions of the user and the self-role;
the operating platform includes an operating position and an obstacle system,
the obstacle system provides a limitation mechanism configured to limit the movement range of the user's limbs to perform the permitted micro-action plan at a maximum range M and ensure the user continuously performs any controlling action while the user is not required to move away from the operation position;
the recognizing and capturing device is capable of recognizing and capturing the user permitted micro-action;
wherein the synchronization controlling system performs the steps of:
1) associating corresponding kinetic parts of the user with the virtual action parts of the self-role;
determining enlarging times of an action range of different virtual action parts relative to an action range of the corresponding kinetic parts of the user,
permitting gestures of the two adjacent kinetic parts of the user to be different from gestures of the associating virtual actions parts of the self-role,
further permitting movement of the user and movement of the self-role to be different,
further satisfying a condition in which the self-role is not lying or sitting while the user is lying or sitting at the operating position and need not leave away from the operation position;
2) the maximum range value M is set for each of the user permitted micro-actions which are performed by the user or a prop, a maximum range value N is set for the virtual permission actions which are performed by the self-role, where N is less than a movement limit of the corresponding kinetic part of the user, supposing the action range of the micro-action permitted by the user in time t is Mt, the action range of the virtual permission action performed by the self-role is Nt, then if Mt≥M, Nt=N; if Mt<M, N>Nt>Mt;
3) the virtual action plan refers to the action or action plan performed by the self-role or a prop in the virtual environment and defined by the =virtual environment.

15. The man-machine interaction controlling system as claimed in claim 14, further comprising one or more of the following features:
1) displaying the imaging device of the virtual environment to make the images of the virtual environment cover the vision of user and enabling the user only to see the animation view of the virtual environment and do not see the body of himself/herself;
2) the recognizing and capturing device including a plurality of position sensing elements with different distinct characters to make the computer to recognize the user's parts corresponding to the position sensing elements;
3) the obstacle system further including a reaction sensing device and/or action sensing device; the obstacle system acting to the corresponding parts of the user according to the characters of the action of the object when any object in the virtual environment acts to one or some parts of the self-role; the reaction sensing device determining the reaction parts and effect acted to the self-role to make the corresponding acted parts of the user to be proportional to the determined reaction effect according to the action characters and the instantaneous state of the self-role;
4) the system further comprising one or more of a olfactory system, a tactile system, a physical fatigue random obstacle system.

16. The man-machine interaction controlling system as claimed in claim 15, wherein the obstacle system changes the load which the reaction sensing device and the action sensing device put on the user according to the physical fatigue degree or the biggest motion ability of the self-role.

* * * * *